(12) United States Patent
Hsu et al.

(10) Patent No.: US 12,153,337 B2
(45) Date of Patent: Nov. 26, 2024

(54) EXTREME ULTRAVIOLET MASK WITH TANTALUM BASE ALLOY ABSORBER

(71) Applicant: Taiwan Semiconductor Manufacturing Co., Ltd., Hsinchu (TW)

(72) Inventors: Pei-Cheng Hsu, Hsinchu (TW); Ta-Cheng Lien, Hsinchu (TW); Hsin-Chang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/395,234

(22) Filed: Dec. 22, 2023

(65) Prior Publication Data

US 2024/0192581 A1    Jun. 13, 2024

Related U.S. Application Data

(63) Continuation of application No. 17/331,517, filed on May 26, 2021, now Pat. No. 11,852,965.

(60) Provisional application No. 63/108,187, filed on Oct. 30, 2020.

(51) Int. Cl.
   *G03F 1/24*    (2012.01)
(52) U.S. Cl.
   CPC .................................. *G03F 1/24* (2013.01)
(58) Field of Classification Search
   CPC ............................................ G03F 1/24
   USPC ............................................................ 430/5
   See application file for complete search history.

(56) References Cited

U.S. PATENT DOCUMENTS

| | | |
|---|---|---|
| 9,239,515 B2 | 1/2016 | Hayashi |
| 10,001,699 B2 | 6/2018 | Orihara et al. |
| 2014/0011123 A1 | 1/2014 | Okamura et al. |
| 2014/0356770 A1 | 12/2014 | Hayashi |
| 2020/0026178 A1 | 1/2020 | Jindal et al. |
| 2020/0133111 A1 | 4/2020 | Liu et al. |
| 2022/0137499 A1 | 5/2022 | Hsu et al. |
| 2022/0382148 A1 | 12/2022 | Hsu et al. |
| 2023/0013260 A1 | 1/2023 | Lin et al. |

FOREIGN PATENT DOCUMENTS

| | | |
|---|---|---|
| DE | 112006000716 T5 | 3/2008 |
| DE | 112012000658 T5 | 11/2013 |
| KR | 10-2012-0081644 A | 7/2012 |
| KR | 10-2019-0117745 A | 10/2019 |
| KR | 10-2020-0115191 A | 10/2020 |
| TW | 201921086 A | 6/2019 |
| TW | 202008073 A | 2/2020 |
| TW | 202026770 A | 7/2020 |

*Primary Examiner* — Christopher G Young
(74) *Attorney, Agent, or Firm* — Seed IP Law Group LLP

(57) ABSTRACT

An extreme ultraviolet mask including a substrate, a reflective multilayer stack on the substrate and a patterned absorber layer on the reflective multilayer stack is provided. The patterned absorber layer includes an alloy comprising tantalum and at least one alloying element. The at least one alloying element includes at least one transition metal element or at least one Group 14 element.

20 Claims, 26 Drawing Sheets

EXTREME ULTRAVIOLET MASK WITH TANTALUM BASE ALLOY ABSORBER

PRIORITY CLAIM AND CROSS-REFERENCE

This application is a continuation application of U.S. patent application Ser. No. 17/331,517, filed May 26, 2021, which claims the benefit of U.S. Provisional Patent Application No. 63/108,187, filed Oct. 30, 2020, each of which is incorporated by reference herein in its entirety.

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
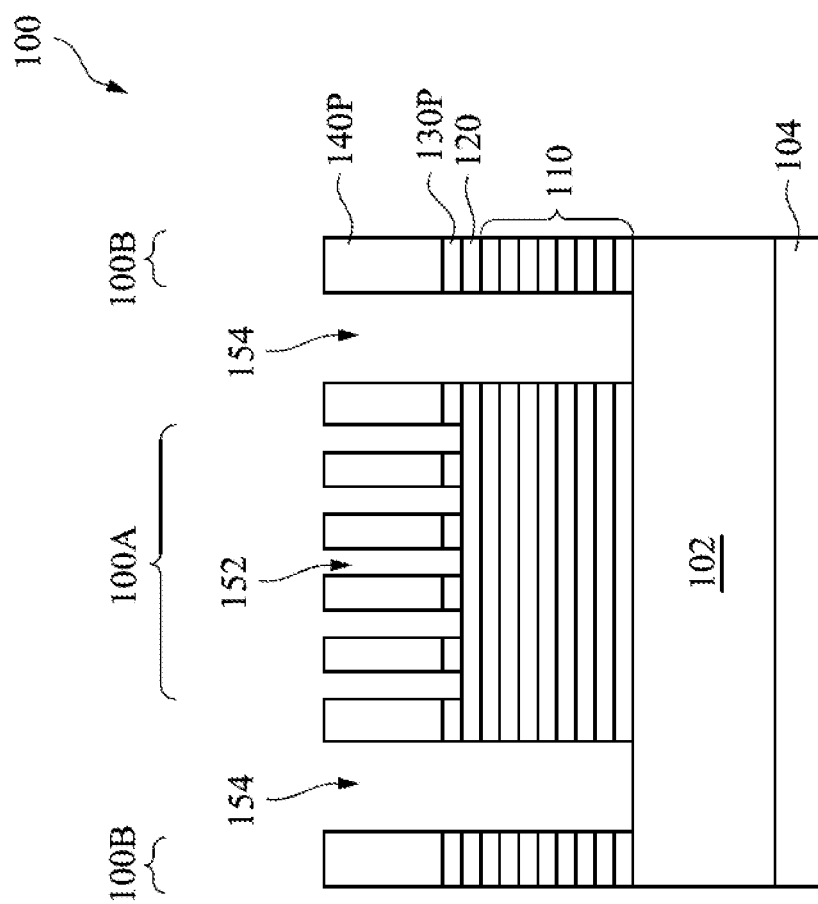
FIG. 1 is a cross-sectional view of an extreme ultraviolet (EUV) mask, in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacture of integrated circuits (ICs), patterns representing different layers of the ICs are fabricated using a series of reusable photomasks (also referred to herein as photolithography masks or masks) in order to transfer the design of each layer of the ICs onto a semiconductor substrate during the semiconductor device fabrication process.

With the shrinkage in IC size, extreme ultraviolet (EUV) light with a wavelength of 13.5 nm is employed in, for example, a lithographic process to enable transfer of very small patterns (e.g., nanometer-scale patterns) from a mask to a semiconductor wafer. Because most materials are highly absorbing at the wavelength of 13.5 nm, EUV lithography utilizes a reflective-type EUV mask having a reflective multilayer to reflect the incident EUV light and an absorber layer on top of the reflective multilayer to absorb radiation in areas where light is not supposed to be reflected by the mask. The mask pattern is defined by the absorber layer and is transferred to a semiconductor wafer by reflecting EUV light off portions of a reflective surface of the EUV mask.

In EUV lithography, to separate the reflected light from the incident light, the EUV mask is illuminated with obliquely incident light that is tilted at a 6-degree angle from normal. The oblique incident EUV light is reflected by the reflective multilayer or absorbed by the absorber layer. On that occasion, if the absorber layer is thick, at the time of EUV lithography, a shadow may be formed. The mask shadowing effects, also known as mask 3D effects, can result in unwanted feature-size dependent focus and pattern placement shifts. The mask 3D effects become worse as the technology node advances.

In embodiments of the present disclosure, tantalum (Ta)-based alloys with a high extinction coefficient K in the EUV wavelength range are developed. In some embodiments, the Ta-based alloy is comprised of Ta and an alloying element such as a transition metal element or a Group 14 element. By using these tantalum (Ta)-based alloys as absorber materials in EUV masks or mask blanks, a thinner absorber can be used to reduce the mask 3D effects and exposure energy. As a result, the scanner throughput is improved. In some embodiments, the tantalum (Ta)-based alloys may be doped with an interstitial element such as nitrogen (N), oxygen (O), carbon (C) or boron (B) to increase the density of the absorber material.

FIG. 1 is a cross-sectional view of an EUV mask 100, in accordance with a first embodiment of the present disclosure. Referring to FIG. 1, the EUV mask 100 includes a substrate 102, a reflective multilayer stack 110 over a front surface of the substrate 102, a capping layer 120 over the reflective multilayer stack 110, a patterned buffer layer 130P over the capping layer 120, and a patterned absorber layer 140P over the patterned buffer layer 130P. The EUV mask 100 further includes a conductive layer 104 over a back surface of the substrate 102 opposite the front surface.

The patterned absorber layer 140P and the patterned buffer layer 130P contain a pattern of openings 152 that correspond to circuit patterns to be formed on a semiconductor wafer. The pattern of openings 152 is located in a pattern region 100A of the EUV mask 100, exposing a surface of the capping layer 120. The pattern region 100A is surrounded by a peripheral region 100B of the EUV mask 100. The peripheral region 100B corresponds to a non-patterned region of the EUV mask 100 that is not used in an exposing process during IC fabrication. In some embodiments, the pattern region 100A of EUV mask 100 is located at a central region of the substrate 102, and the peripheral region 100B is located at an edge portion of the substrate 102. The pattern region 100A is separated from the peripheral region 100B by trenches 154. The trenches 154 extend through the patterned absorber layer 140P, the patterned buffer layer 130P, the capping layer 120, and the reflective multilayer stack 110, exposing the front surface of the substrate 102.

Figure 2:
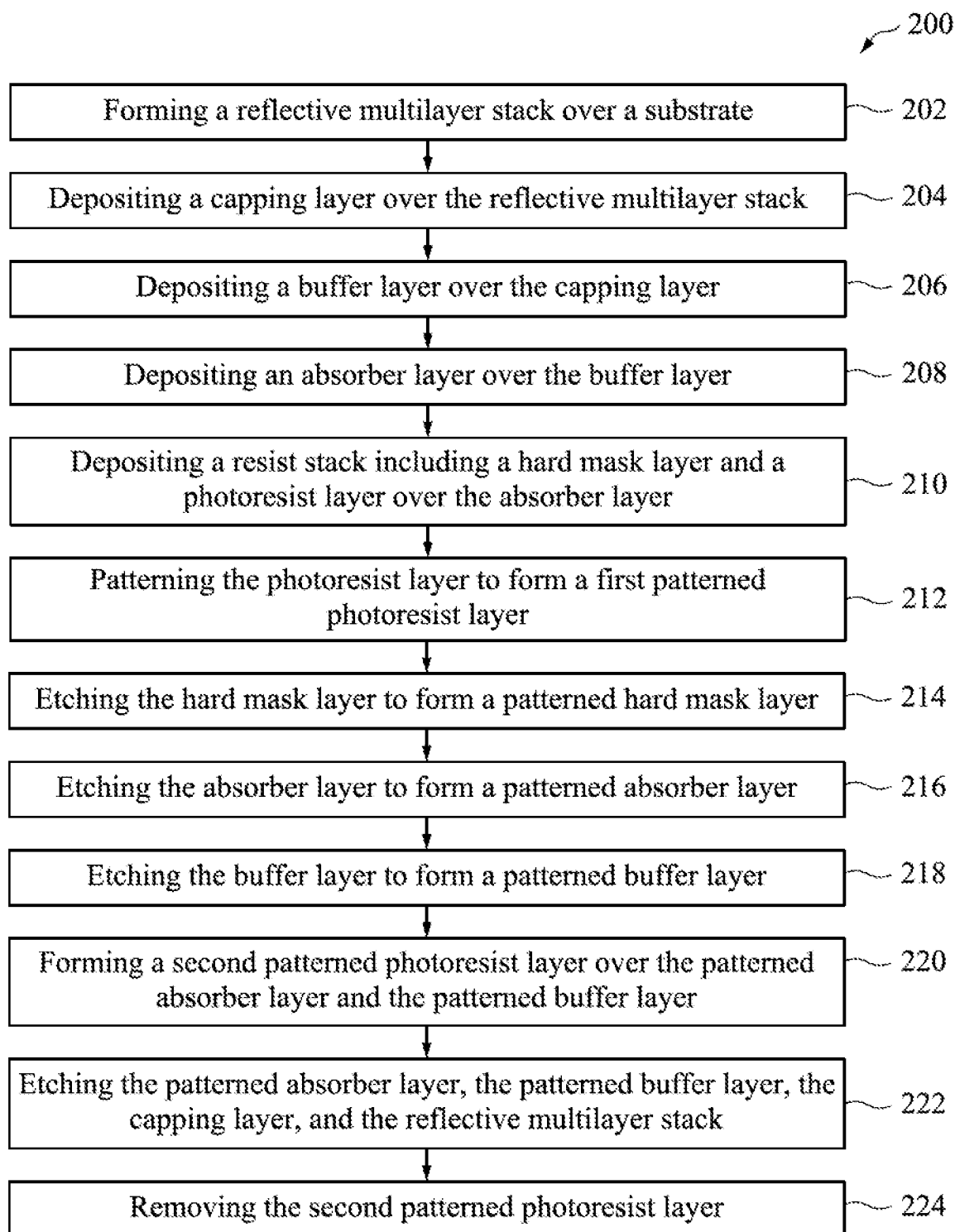
FIG. 2 is a flowchart of a method for fabricating the EUV mask of FIG. 1, in accordance with some embodiments.

FIG. 2 is a flowchart of a method 200 for fabricating an EUV mask, for example, EUV mask 100, in accordance with some embodiments. FIG. 3A through FIG. 3L are cross-sectional views of the EUV mask 100 at various stages of the fabrication process, in accordance with some embodiments. The method 200 is discussed in detail below, with reference to the EUV mask 100. In some embodiments, additional operations are performed before, during, and/or after the method 200, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 3A:
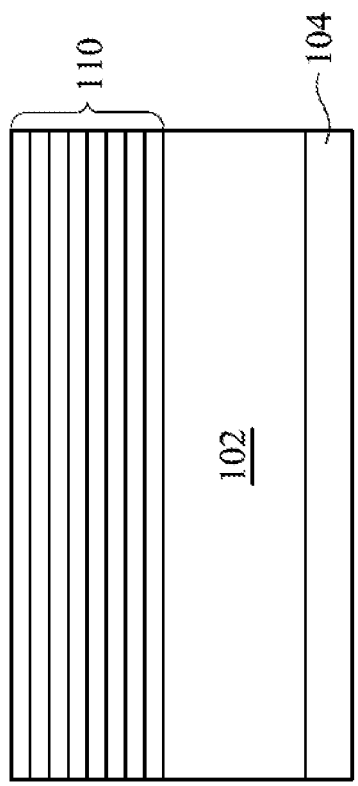
FIGS. 3A-3L are cross-sectional views of an EUV mask at various stages of the fabrication process of FIG. 2, in accordance with some embodiments.

Referring to FIGS. 2 and 3A, the method 200 includes operation 202, in which a reflective multilayer stack 110 is formed over a substrate 102, in accordance with some embodiments. FIG. 3A is a cross-sectional view of an initial structure of an EUV mask 100 after forming the reflective multilayer stack 110 over the substrate 102, in accordance with some embodiments.

Referring to FIG. 3A, the initial structure of the EUV mask 100 includes a substrate 102 made of glass, silicon, or other low thermal expansion materials. The low thermal expansion material helps to minimize image distortion due to mask heating during use of the EUV mask 100. In some embodiments, the substrate 102 includes fused silica, fused quartz, calcium fluoride, silicon carbide, black diamond, or titanium oxide doped silicon oxide ($SiO_2/TiO_2$). In some embodiments, the substrate 102 has a thickness ranging from about 1 mm to about 7 mm. If the thickness of the substrate 102 is too small, a risk of breakage or warping of the EUV mask 100 increases, in some instances. On the other hand, if the thickness of the substrate is too great, a weight of the EUV mask 100 is needlessly increased, in some instances.

In some embodiments, a conductive layer 104 is disposed on a back surface of the substrate 102. In some embodiments, the conductive layer 104 is in direct contact with the back surface of the substrate 102. The conductive layer 104 is adapted to provide for electrostatically coupling of the EUV mask 100 to an electrostatic mask chuck (not shown) during fabrication and use of the EUV mask 100. In some embodiments, the conductive layer 104 includes chromium nitride (CrN) or tantalum boride (TaB). In some embodiments, the conductive layer 104 is formed by a deposition process such as, for example, chemical vapor deposition (CVD), plasma-enhanced chemical vapor deposition (PECVD), or physical vapor deposition (PVD). The thickness of the conductive layer 104 is controlled such that the conductive layer 104 is optically transparent.

The reflective multilayer stack 110 is disposed over a front surface of the substrate 102 opposite the back surface. In some embodiments, the reflective multilayer stack 110 is in directly contact with the front surface of the substrate 102. The reflective multilayer stack 110 provides a high reflectivity to the EUV light. In some embodiments, the reflective multilayer stack 110 is configured to achieve about 60% to about 75% reflectivity at the peak EUV illumination wavelength, e.g., the EUV illumination at 13.5 nm. Specifically, when the EUV light is applied at an incident angle of 6° to the surface of the reflective multilayer stack 110, the maximum reflectivity of light in the vicinity of a wavelength of 13.5 nm is about 60%, about 62%, about 65%, about 68%, about 70%, about 72%, or about 75%

In some embodiments, the reflective multilayer stack 110 includes alternatively stacked layers of a high refractive index material and a low refractive index material. A material having a high refractive index has a tendency to scatter EUV light on the one hand, and a material having a low refractive index has a tendency to transmit EUV light on the other hand. Pairing these two type materials together provides a resonant reflectivity. In some embodiments, the reflective multilayer stack 110 includes alternatively stacked layers of molybdenum (Mo) and silicon (Si). In some embodiments, the reflective multilayer stack 110 includes alternatively stacked Mo and Si layers with Si being in the topmost layer. In some embodiments, a molybdenum layer is in direct contact with the front surface of the substrate 102. In other some embodiments, a silicon layer is in direct contact with the front surface of the substrate 102. Alternatively, the reflective multilayer stack 110 includes alternatively stacked layers of Mo and beryllium (Be).

The thickness of each layer in the reflective multilayer stack 110 depends on the EUV wavelength and the incident angle of the EUV light. The thickness of alternating layers in the reflective multilayer stack 110 is tuned to maximize the constructive interference of the EUV light reflected at each interface and to minimize the overall absorption of the EUV light. In some embodiments, the reflective multilayer stack 110 includes from 30 to 60 pairs of alternating layers of Mo and Si. Each Mo/Si pair has a thickness ranging from about 2 nm to about 7 nm, with a total thickness ranging from about 100 nm to about 300 nm.

In some embodiments, each layer in the reflective multilayer stack 110 is deposited over the substrate 102 and underlying layer using ion beam deposition (IBD) or DC magnetron sputtering. The deposition method used helps to ensure the thickness uniformity of the reflective multilayer stack 110 is better than about 0.85 across the substrate 102. For example, to form a Mo/Si reflective multilayer stack 110, a Mo layer is deposited using a Mo target as the sputtering target and an argon (Ar) gas (having a gas pressure of from $1.3 \times 10^{-2}$ Pa to $2.7 \times 10^{-2}$ Pa) as the sputtering gas with an ion acceleration voltage of from 300 V to 1,500 V at a deposition rate of from 0.03 to 0.30 nm/sec and then a Si layer is deposited using a Si target as the sputtering target and an Ar gas (having a gas pressure of $1.3 \times 10^{-2}$ Pa to $2.7 \times 10^{-2}$ Pa) as the sputtering gas, with an ion acceleration voltage of from 300 V to 1,500 V at a deposition rate of from 0.03 to 0.30 nm/sec. By stacking Si layers and Mo layers in 40 to 50 cycles, each of the cycles comprising the above steps, the Mo/Si reflective multilayer stack is deposited.

Figure 3B:
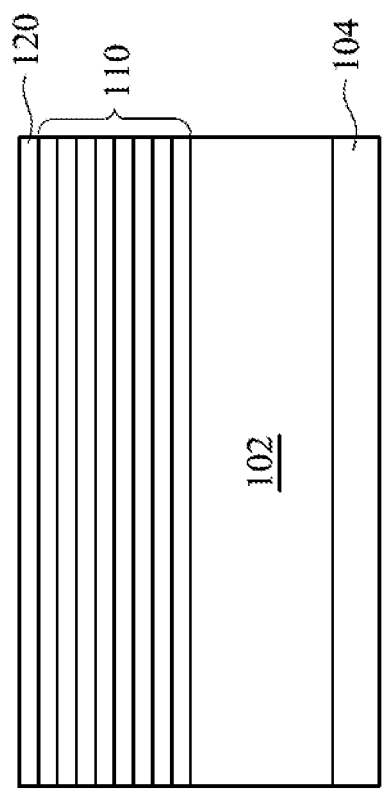

Referring to FIGS. 2 and 3B, the method 200 proceeds to operation 204, in which a capping layer 120 is deposited over the reflective multilayer stack 110, in accordance with some embodiments. FIG. 3B is a cross-sectional view of the structure of FIG. 3A after depositing the capping layer 120 over the reflective multilayer stack 110, in accordance with some embodiments.

Referring to FIG. 3B, the capping layer 120 is disposed over the topmost surface of the reflective multilayer stack 110. The capping layer 120 helps to protect the reflective multilayer stack 110 from oxidation and any chemical etchants to which the reflective multilayer stack 110 may be exposed during subsequent mask fabrication processes.

In some embodiments, the capping layer 120 includes a material that resists oxidation and corrosion, and has a low chemical reactivity with common atmospheric gas species such as oxygen, nitrogen, and water vapor. In some embodiments, the capping layer 120 includes a transition metal such as, for example, ruthenium (Ru), iridium (Ir), rhodium (Rh), platinum (Pt), palladium (Pd), osmium (Os), rhenium (Re), vanadium (V), tantalum (Ta), hafnium (Hf), tungsten (W), molybdenum (Mo), zirconium (Zr), manganese (Mn), technetium (Tc), or alloys thereof.

In some embodiments, the capping layer 120 is formed using a deposition process such as, for example, IBD, chemical vapor deposition (CVD), physical vapor deposition (PVD), or atomic layer deposition (ALD). In instances where a Ru layer is to be formed as the capping layer 120 using IBD, the deposition may be carried out in an Ar atmosphere by using a Ru target as the sputtering target.

Figure 3C:
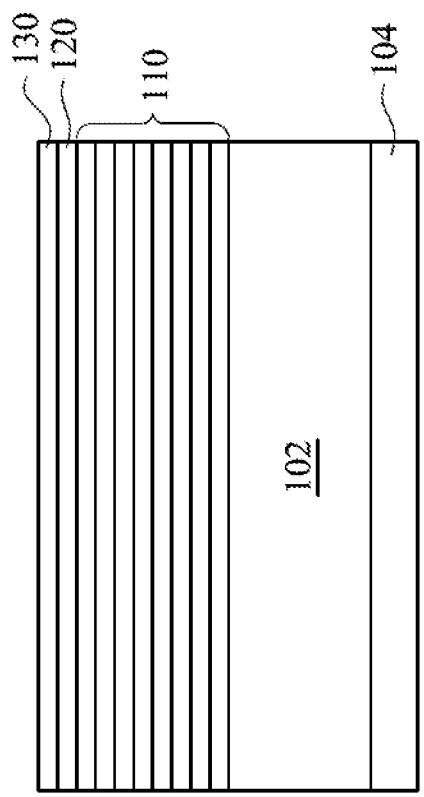

Referring to FIGS. 2 and 3C, the method 200 proceeds to operation 206, in which a buffer layer 130 is deposited over the capping layer 120, in accordance with some embodiments. FIG. 3C is a cross-sectional view of the structure of FIG. 3B after depositing the buffer layer 130 over the capping layer 120, in accordance with some embodiments.

Referring to FIG. 3C, the buffer layer 130 is disposed on the capping layer 120. The buffer layer 130 possesses different etching characteristics from an absorber layer subsequently formed thereon, and thereby serves as an etch stop layer to prevent damages to the capping layer 120 during patterning of an absorber layer subsequently formed thereon. Further, the buffer layer 130 may also serve later as a sacrificial layer for focused ion beam repair of defects in the absorber layer. In some embodiments, the buffer layer 130 includes ruthenium boride (RuB), ruthenium silicide (RuSi), chromium oxide (CrO), or chromium nitride (CrN). In some other embodiments, the buffer layer 130 includes a dielectric material such as, for example, silicon oxide or silicon oxynitride. In some embodiments, the buffer layer 130 is deposited by CVD, PECVD, or PVD.

Figure 3D:
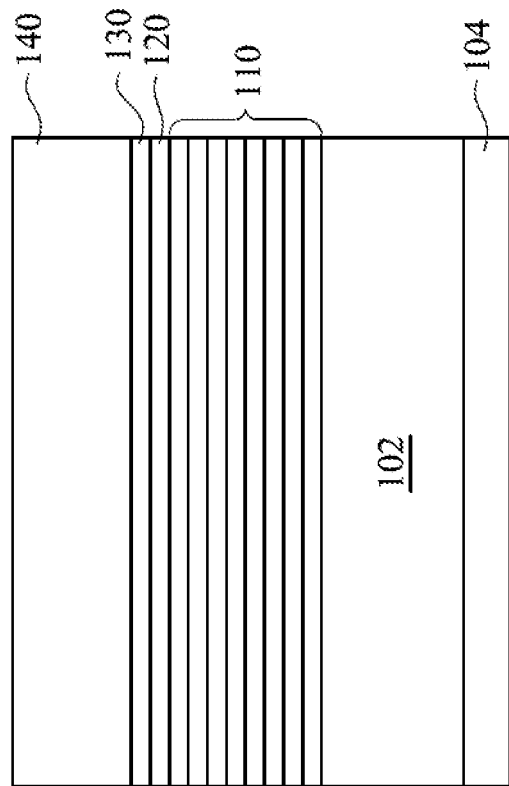

Referring to FIGS. 2 and 3D, the method 200 proceeds to operation 208, in which an absorber layer 140 is deposited over the buffer layer 130, in accordance with various embodiments. FIG. 3D is a cross-sectional view of the structure of FIG. 3C after depositing the absorber layer 140 over the buffer layer 130, in accordance with some embodiments.

Referring to FIG. 3D, the absorber layer 140 is disposed in direct contact with the buffer layer 130. The absorber layer 140 is usable to absorb radiation in the EUV wavelength projected onto the EUV mask 100.

The absorber layer 140 includes an absorber material having a high extinction coefficient K and a low refractive index n in EUV wavelengths. In some embodiments, the absorber layer 140 includes an absorber material having a high extinction coefficient and a low refractive index at 13.5 nm wavelength. In some embodiments, the extinction coefficient k of the absorber material of the absorber layer 140 is in a range from about 0.01 to 0.08. In some embodiments, the refractive index n of the absorber material of the absorber layer 140 is in a range from 0.87 to 1.

In some embodiments, the absorber layer 140 includes or is made of a Ta-based alloy comprised of Ta and at least one alloying element. In some embodiments, the Ta-based alloy is a Ta-rich alloy having a Ta concentration ranging from greater than 50 atomic % and up to 90 atomic %. In other embodiments, the Ta-based alloy is an alloying element-rich alloy having an alloying element concentration ranging from more than 50 atomic % and up to 90 atomic %.

In some embodiments, the Ta-based alloy is comprised of Ta and at least one transition metal element. Examples of transition metal elements include, but are not limited to titanium (Ti), zirconium (Zr), hafnium (Hf), vanadium (V), niobium (Nb), chromium (Cr), molybdenum (Mo), tungsten (W), iron (Fe), ruthenium (Ru), cobalt (Co), rhodium (Rh), iridium (Ir), nickel (Ni), palladium (Pd), platinum (Pt), and gold (Au). In some embodiments, the Ta-based alloy includes tantalum chromium (TaCr), tantalum hafnium (TaHf), tantalum iridium (TaIr), tantalum nickel (TaNi), tantalum ruthenium (TaRu), tantalum cobalt (TaCo), tantalum gold (TaAu), tantalum molybdenum (TaMo), tantalum tungsten (TaW), tantalum iron (TaFe), tantalum rhodium (TaRh), tantalum vanadium (TaV), tantalum niobium (TaNb), tantalum palladium (TaPd), tantalum zirconium (TaZr), tantalum titanium (TaTi), or tantalum platinum (TaPt). In some embodiments, the Ta-based alloy is comprised of Ta and a Group 14 element such as silicon or germanium. For example, in some embodiments, the Ta-based alloy is tantalum silicon (TaSi) or tantalum germanium (TaGe).

In some embodiments, the Ta-based alloy is further doped with one or more interstitial elements such as boron (B), carbon (C), nitrogen (N), and oxygen (O). The interstitial element dopants increase the material density, which leads to an increase in the strength of the resulting alloy. In some embodiments, the absorber layer 140 is comprised of Ta, the alloying element and nitrogen. For example, in some embodiments, the absorber layer 140 includes TaCrN, TaHfN, TaIrN, TaNlN, TaRUN, TaCON, TaAuN, TaMON, TaWN, TaFeN, TaRhN, TaVN, TaNbN, TaPdN, TaZrN, TaTiN, TaPtN or TaSiN. In some embodiments, the absorber layer 140 is comprised of Ta, the alloying element, nitrogen and oxygen. For example, in some embodiments, the absorber layer 140 includes TaCrON, TaHfON, TaIrON, TaNiON, TaRuON, TaCoON, TaAuON, TaMoON, TaWON, TaFeON, TaRhON, TaVON, TaNbON, TaPdON, TaZrON, TaTiON, TaPtON, or TaSiON.

In some embodiments, the absorber layer 140 has a single layer structure. In some other embodiments, the absorber layer 140 has a multilayer structure. In some embodiments, the absorber layer 140 is formed by a deposition process such as, for example, PVD, CVD, ALD, RF magnetron sputtering, DC magnetron sputtering, or IBD. In instances where the absorber layer 140 includes TaCr, the TaCr layer may be formed from a TaCr target with argon (Ar) as the inert sputtering gas. In instances where the absorber layer 140 includes TaCrN, the TaCrN layer may be formed from a TaCr target with nitrogen ($N_2$) as the reactive gas and Ar as the inert sputtering gas. In instances where the absorber layer 140 includes TaCrON, the TaCrON layer may be formed from a TaCrO target with $N_2$ as the reactive gas and Ar as the inert sputtering gas. In some embodiments, the $N_2$ gas concentration may be from 3 vol % to 80 vol %, from 5 vol % to 30 vol %, or from 8 vol % to 15 vol %. The gas pressure may be from $0.5\times10^{-1}$ Pa to $10\times10^{-1}$ Pa, from $0.5\times10^{-1}$ Pa to $5\times10^{-1}$ Pa, or from $0.5\times10^{-1}$ Pa to $3\times10^{-1}$ Pa.

The absorber layer 140 is deposited as an amorphous layer. By maintaining an amorphous phase, the overall roughness of the absorber layer 140 is improved. The thickness of the absorber layer 140 is controlled to provide between 95% and 99.5% absorption of the EUV light at 13.5 nm. In some embodiments, the absorber layer 140 may have a thickness ranging from about 5 nm to about 50 nm. If the thickness of the absorber layer 140 is too small, the absorber layer 140 is not able to absorb a sufficient amount of the EUV light to generate contrast between the reflective areas and non-reflective areas. On the other hand, if the thickness of the absorber layer 140 is too great, the precision of a pattern to be formed in the absorber layer 140 tends to be low.

In embodiments of the present disclosure, by using Ta-based alloys having a high extinction coefficient k as the absorber material, the mask 3D effects caused by EUV phase distortion can be reduced. As a result, the best focus shifts and pattern placement error can be reduced, while the normalized image log-slope (NILS) can be increased.

Figure 3E:
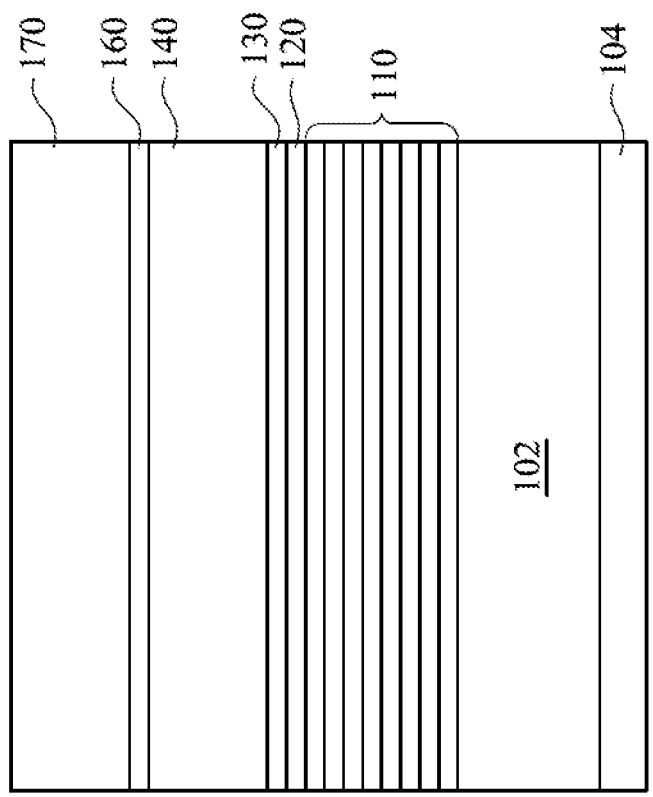

Referring to FIGS. 2 and 3E, the method 200 proceeds to operation 210, in which a resist stack including a hard mask layer 160 and a photoresist layer 170 is deposited over the absorber layer 140, in accordance with some embodiments. FIG. 3E is a cross-sectional view of the structure of FIG. 3D after sequentially depositing the hard mask layer 160 and the photoresist layer 170 over the absorber layer 140, in accordance with some embodiments.

Referring to FIG. 3E, the hard mask layer 160 is disposed over the absorber layer 140. In some embodiments, the hard mask layer 160 is in direct contact with the absorber layer 140. In some embodiments, the hard mask layer 160 includes a dielectric oxide such as silicon dioxide or a dielectric nitride such as silicon nitride. In some embodiments, the hard mask layer 160 is formed using a deposition process such as, for example, CVD, PECVD, or PVD.

The photoresist layer 170 is disposed over the hard mask layer 160. The photoresist layer 170 includes a photosensitive material operable to be patterned by radiation. In some embodiments, the photoresist layer 170 includes a positive-tone photoresist material, and a negative-tone photoresist material or a hybrid-tone photoresist material. In some embodiments, the photoresist layer 170 is applied to the surface of the hard mask layer 160, for example, by spin coating.

Figure 3F:
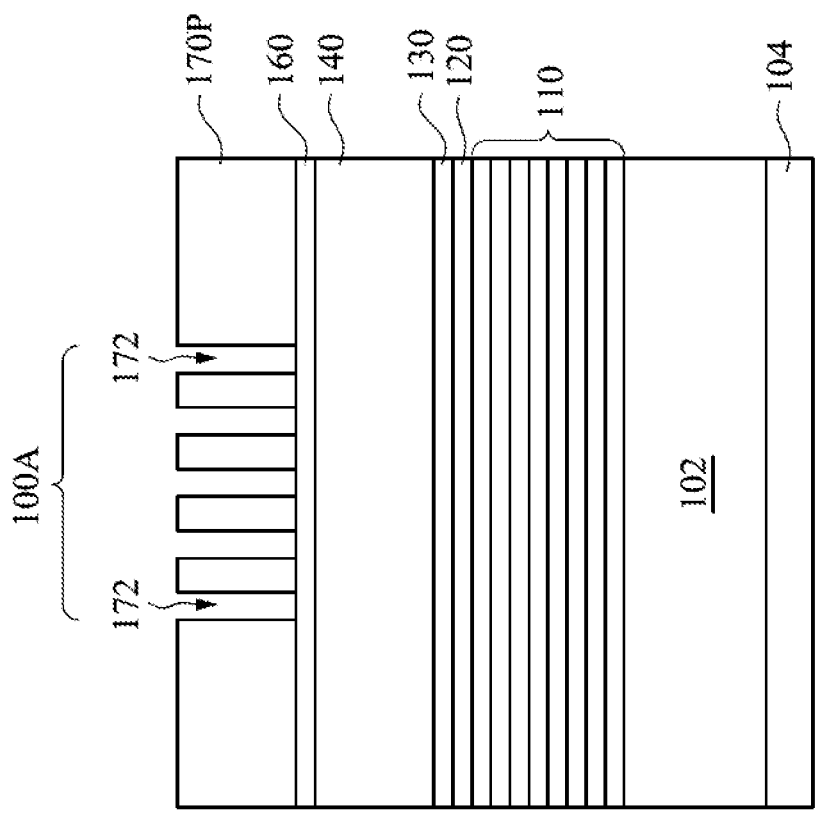

Referring to FIGS. 2 and 3F, the method 200 proceeds to operation 212, in which the photoresist layer 170 is lithographically patterned to form a patterned photoresist layer 170P, in accordance with some embodiments. FIG. 3F is a cross-sectional view of the structure of FIG. 3E after lithographically patterning the photoresist layer 170 to form the patterned photoresist layer 170P, in accordance with some embodiments.

Referring to FIG. 3F, the photoresist layer 170 is patterned by first subjecting the photoresist layer 170 to a pattern of irradiation. Next, the exposed or unexposed portions of the photoresist layer 170 are removed depending on whether a positive-tone or negative-tone resist is used in the photoresist layer 170 with a resist developer, thereby forming the patterned photoresist layer 170P having a pattern of openings 172 formed therein. The openings 172 expose portions of the hard mask layer 160. The openings 172 are located in the pattern region 100A and correspond to locations where the pattern of openings 152 are present in the EUV mask 100 (FIG. 1).

Figure 3G:
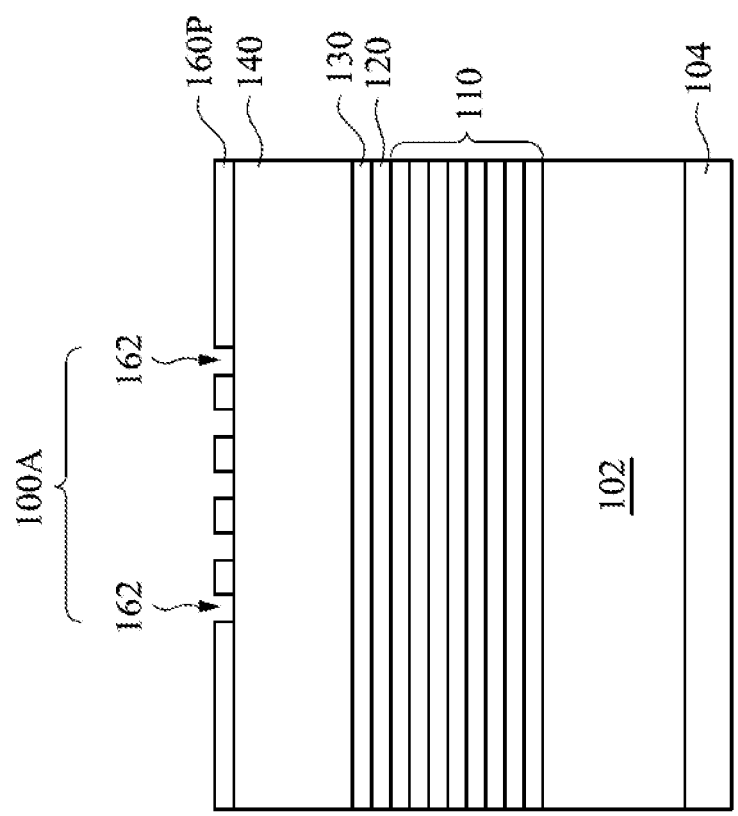

Referring to FIGS. 2 and 3G, the method 200 proceeds to operation 214, in which the hard mask layer 160 is etched using the patterned photoresist layer 170P as an etch mask to form a patterned hard mask layer 160P, in accordance with some embodiments. FIG. 3G is a cross-sectional view of the structure of FIG. 3F after etching the hard mask layer 160 to form the patterned hard mask layer 160P, in accordance with some embodiments.

Referring to FIG. 3G, portions of the hard mask layer 160 that are exposed by the openings 172 are etched to form openings 162 extending through the hard mask layer 160. The openings 162 expose portions of the underlying absorber layer 140. In some embodiments, the hard mask layer 160 is etched using an anisotropic etch. In some embodiments, the anisotropic etch is a dry etch such as, for example, reactive ion etch (RIE), a wet etch, or a combination thereof. The etch removes the material providing the hard mask layer 160 selective to the material providing the absorber layer 140. The remaining portions of the hard mask layer 160 constitute the patterned hard mask layer 160P. If not completely consumed during the etching of the hard mask layer 160, after etching the hard mask layer 160, the patterned photoresist layer 170P is removed from the surfaces of the patterned hard mask layer 160P, for example, using wet stripping or plasma ashing.

Figure 3H:
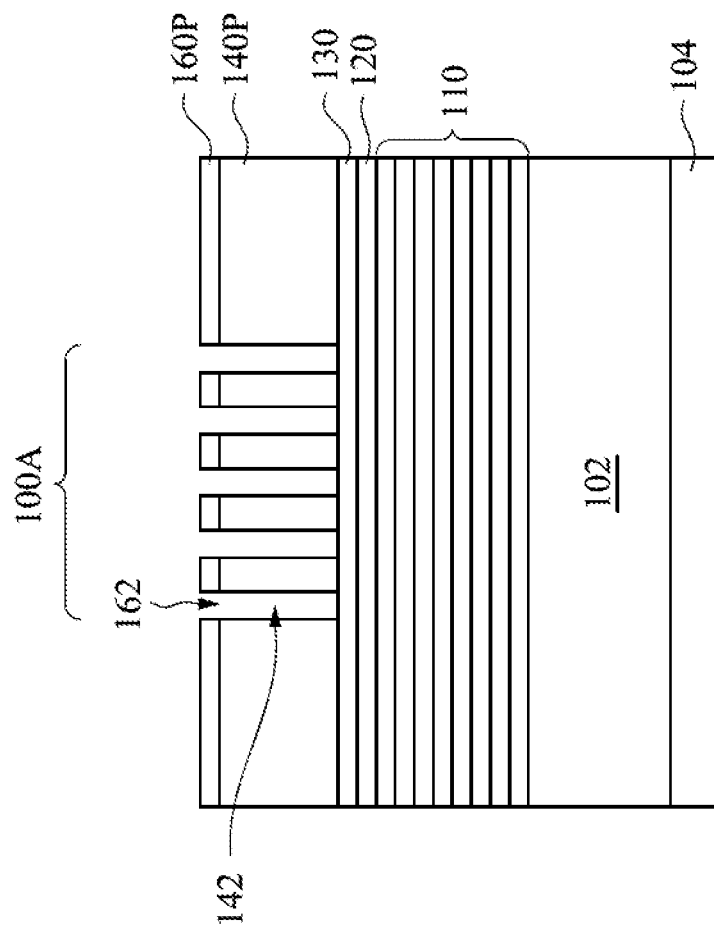

Referring to FIGS. 2 and 3H, the method 200 proceeds to operation 216, in which the absorber layer 140 is etched using the patterned hard mask layer 160P as an etch mask to form a patterned absorber layer 140P, in accordance with some embodiments. FIG. 3H is a cross-sectional view of the structure of FIG. 3G after etching the absorber layer 140 to form the patterned absorber layer 140P, in accordance with some embodiments.

Referring to FIG. 3H, portions of the absorber layer 140 that are exposed by the openings 162 are etched to form openings 142 extending through the absorber layer 140. The openings 142 expose portions of the underlying buffer layer 130. In some embodiments, the absorber layer 140 is etched using an anisotropic etching process. In some embodiments, the anisotropic etch is a dry etch such as, for example, RIE, a wet etch, or a combination thereof that removes the material providing the absorber layer 140 selective to the material providing the underlying buffer layer 130. For example, in some embodiments, the absorber layer 140 is dry etched with a gas that contains chlorine, such as $Cl_2$ or $BCl_3$, or with a gas that contains fluorine, such as $NF_3$. Ar may be used as a carrier gas. In some embodiments, oxygen ($O_2$) may also be included as the carrier gas. The etch rate and the etch selectivity depend on the etchant gas, etchant flow rate, power, pressure, and substrate temperature. After etching, the remaining portions of the absorber layer 140 constitute the patterned absorber layer 140P.

Figure 3I:
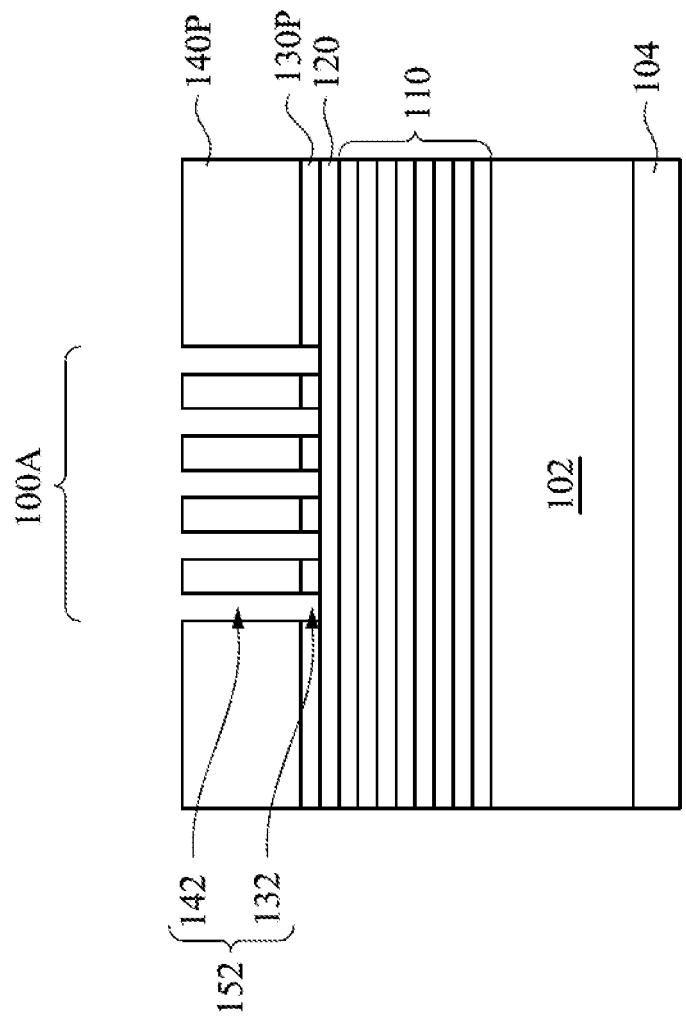

Referring to FIGS. 2 and 3I, the method 200 proceeds to operation 218, in which the buffer layer 130 is etched using the patterned hard mask layer 160P as an etch mask to form a patterned buffer layer 130P, in accordance with some embodiments. FIG. 3I is a cross-sectional view of the structure of FIG. 3H after etching the buffer layer 130 to form the patterned buffer layer 130P, in accordance with some embodiments.

Referring to FIG. 3I, portions of the buffer layer 130 that are exposed by the openings 162 and 142 are etched to form openings 132 extending through the buffer layer 130. The openings 132 expose portions of the underlying capping layer 120. In some embodiments, the buffer layer 130 is etched using an anisotropic etching process. In some embodiments, the anisotropic etch is a dry etch such as, for example, RIE, a wet etch, or a combination thereof that removes the material providing the buffer layer 130 selective to the material providing the capping layer 120. The remaining portions of the buffer layer 130 constitute the patterned buffer layer 130P. After etching the buffer layer 130, the patterned hard mask layer 160P is removed from the surfaces of the patterned absorber layer 140P, for example, using oxygen plasma or a wet etch.

The openings 142 in the patterned absorber layer 140P and respective underlying openings 132 in the patterned buffer layer 130P together define the pattern of openings 152 in the EUV mask 100.

Figure 3J:
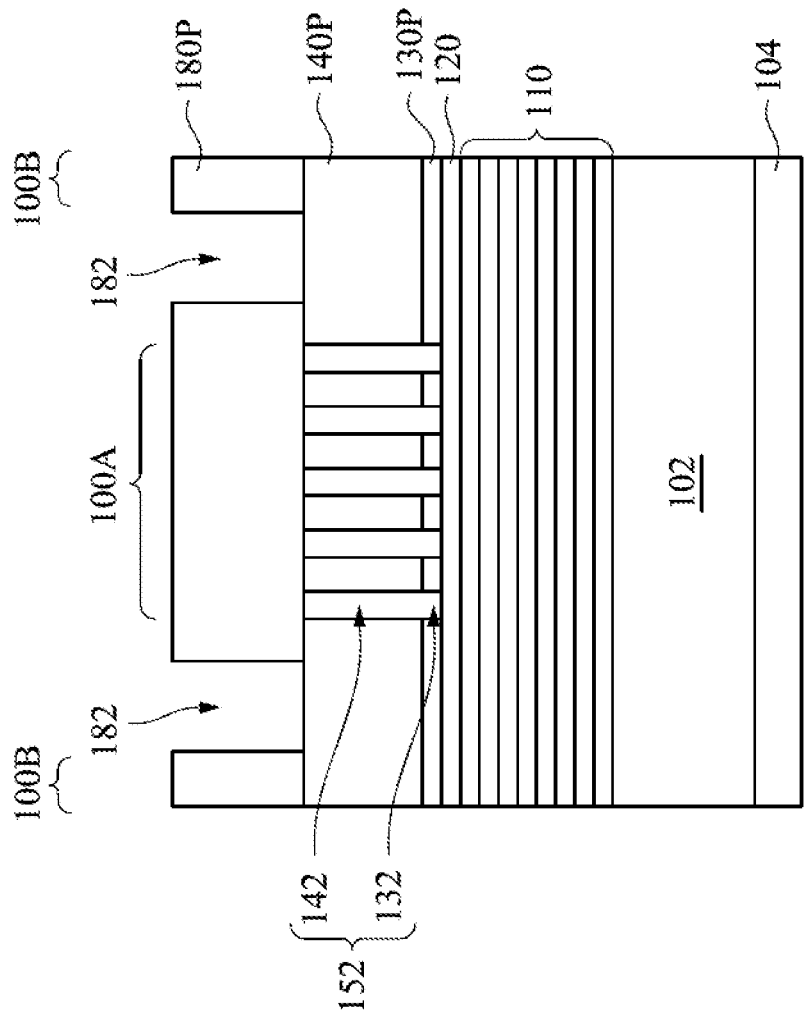

Referring to FIGS. 2 and 3J, the method 200 proceeds to operation 220, in which a patterned photoresist layer 180P comprising a pattern of openings 182 is formed over the patterned absorber layer 140P and the patterned buffer layer 130P, in accordance with some embodiments. FIG. 3J is a cross-sectional view of the structure of FIG. 3I after forming the patterned photoresist layer 180P comprising openings 182 over the patterned absorber layer 140P and the patterned buffer layer 130P, in accordance with some embodiments.

Figure 3K:
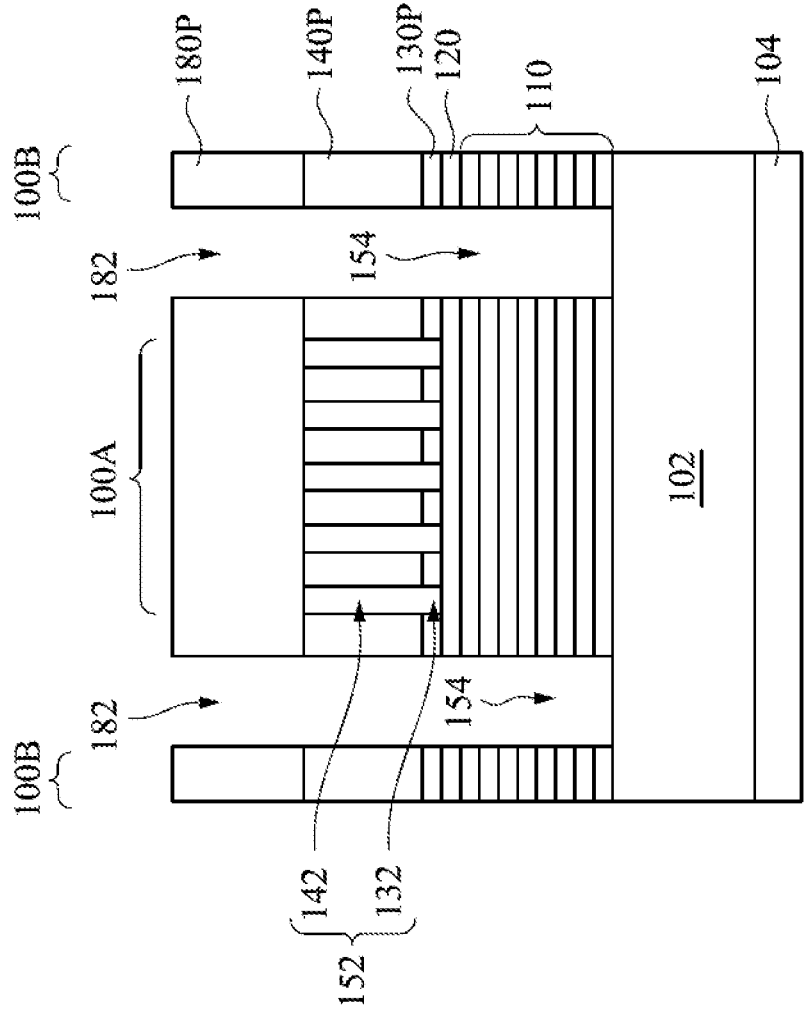

Referring to FIG. 3J, the openings 182 expose portions of the patterned absorber layer 140P at the periphery of the patterned absorber layer 140P. The openings 182 corresponding to the trenches 154 (as shown in FIG. 3K) in the peripheral region 100B of the EUV mask 100 are to be formed. To form the patterned photoresist layer 180P, a photoresist layer (not shown) is applied over the patterned buffer layer 130P and the patterned absorber layer 140P. The photoresist layer fills the openings 132 and 142 in the patterned buffer layer 130P and the patterned absorber layer 140P, respectively. In some embodiments, the photoresist layer includes a positive-tone photoresist material, a negative-tone photoresist material or a hybrid-tone photoresist material. In some embodiments, the photoresist layer includes a same material as the photoresist layer 170 described above in FIG. 3E. In some embodiments, the photoresist layer includes a different material from the photoresist layer 170. In some embodiments, the photoresist layer is formed, for example, by spin coating. The photoresist layer is subsequently patterned by exposing the photoresist layer to a pattern of radiation, and removing the exposed or unexposed portions of the photoresist layer using a resist developer depending on whether a positive or negative resist is used. The remaining portions of the photoresist layer constitute the patterned photoresist layer 180P.

Referring to FIGS. 2 and 3K, the method 200 proceeds to operation 222, in which the patterned absorber layer 140P, the patterned buffer layer 130P if present, the capping layer 120, and the reflective multilayer stack 110 are etched using the patterned photoresist layer 180P as an etch mask to form trenches 154 in the peripheral region 100B of the substrate 102, in accordance with some embodiments. FIG. 3K is a cross-sectional view of the structure of FIG. 3J after etching the patterned absorber layer 140P, the patterned buffer layer 130P if present, the capping layer 120, and the reflective multilayer stack 110, to form the trenches 154 in the peripheral region 100B of the substrate 102, in accordance with some embodiments.

Referring to FIG. 3K, the trenches 154 extend through the patterned absorber layer 140P, the patterned buffer layer 130P if present, the capping layer 120, and the reflective multilayer stack 110 to expose the surface of the substrate 102. The trenches 154 surround the pattern region 100A of the EUV mask 100, separating the pattern region 100A from the peripheral region 100B.

In some embodiments, the patterned absorber layer 140P, the patterned buffer layer 130P, the capping layer 120, and the reflective multilayer stack 110 are etched using a single anisotropic etching process. The anisotropic etch can be a dry etch such as, for example, RIE, a wet etch, or a combination thereof that removes materials of the respective patterned absorber layer 140P, the patterned buffer layer 130P, the capping layer 120, and the reflective multilayer stack 110, selective to the material providing the substrate 102. In some embodiments, the patterned absorber layer 140P, the patterned buffer layer 130P, the capping layer 120, and the reflective multilayer stack 110 are etched using multiple distinct anisotropic etching processes. Each anisotropic etch can be a dry etch such as, for example, RIE, a wet etch, or a combination thereof.

Figure 3L:
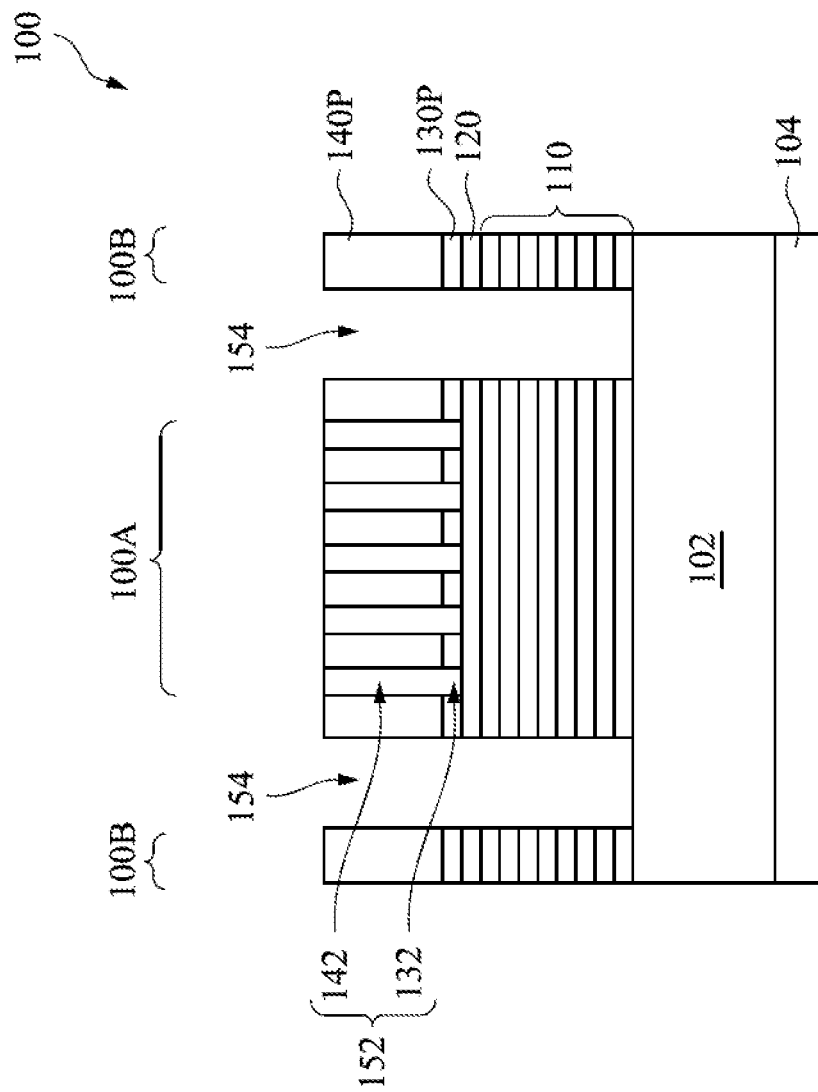

Referring to FIGS. 2 and 3L, the method 200 proceeds to operation 224, in which the patterned photoresist layer 180P is removed, in accordance with some embodiments. FIG. 3L is a cross-sectional view of the structure of FIG. 3K after removing the patterned photoresist layer 180P, in accordance with some embodiments.

Referring to FIG. 3L, the patterned photoresist layer 180P is removed from the pattern region 100A and the peripheral region 100B of the substrate 102, for example, by wet stripping or plasma ashing. The removal of the patterned photoresist layer 180P from the openings 142 in the patterned absorber layer 140P and the openings 132 in the patterned buffer layer 130P re-exposes the surfaces of the capping layer 120 in the pattern region 100A.

An EUV mask 100 is thus formed. The EUV mask 100 includes a substrate 102, a reflective multilayer stack 110 over a front surface of the substrate 102, a capping layer 120 over the reflective multilayer stack 110, a patterned buffer layer 130P over the capping layer 120, and a patterned absorber layer 140P over the patterned buffer layer 130P. The EUV mask 100 further includes a conductive layer 104 over a back surface of the substrate 102 opposite the front surface. The patterned absorber layer 140P includes a Ta-based alloy having a high extinction coefficient, which allows forming a thinner layer. The mask 3D effects caused by the thicker absorber layer can thus be reduced and unnecessary EUV light can be eliminated. As a result, a pattern on the EUV mask 100 can be projected precisely onto a silicon wafer.

After removal of the patterned photoresist layer 180P, the EUV mask 100 is cleaned to remove any contaminants therefrom. In some embodiments, the EUV mask 100 is cleaned by submerging the EUV mask 100 into an ammonium hydroxide ($NH_4OH$) solution. In some embodiments, the EUV mask 100 is cleaned by submerging the EUV mask 100 into a diluted hydrofluoric acid (HF) solution.

The EUV mask 100 is subsequently radiated with, for example, an UV light with a wavelength of 193 nm, for inspection of any defects in the patterned region 100A. The foreign matters may be detected from diffusely reflected light. If defects are detected, the EUV mask 100 is further cleaned using suitable cleaning processes.

Figure 4:
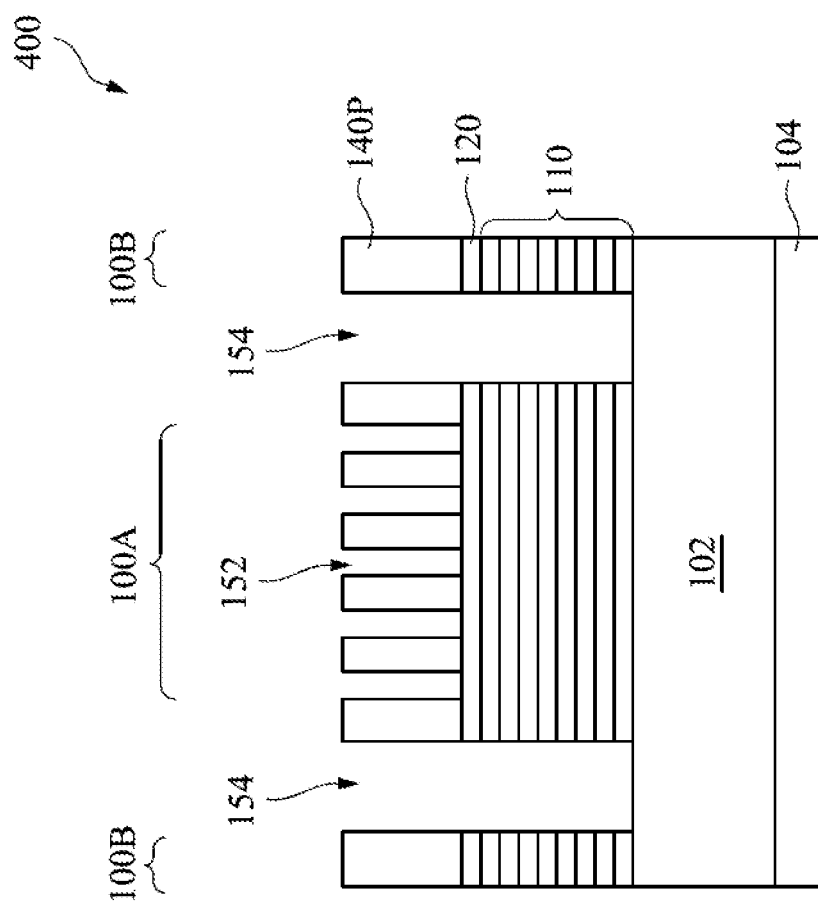
FIG. 4 is a cross-sectional view of an extreme ultraviolet (EUV) mask, in accordance with a second embodiment.

FIG. 4 is a cross-sectional view of an EUV mask 400, in accordance with a second embodiment of the present disclosure. Referring to FIG. 4, the EUV mask 400 includes a substrate 102, a reflective multilayer stack 110 over a front surface of the substrate 102, a capping layer 120 over the reflective multilayer stack 110, and a patterned absorber layer 140P over the capping layer 120. The EUV mask 400 further includes a conductive layer 104 over a back surface of the substrate 102 opposite the front surface. In comparison with the EUV mask 100 of FIG. 1, the patterned buffer layer 130P is omitted in the EUV mask 400. Accordingly, in the EUV mask 400, the patterned absorber layer 140P is in direct contact with the capping layer 120.

Figure 5:
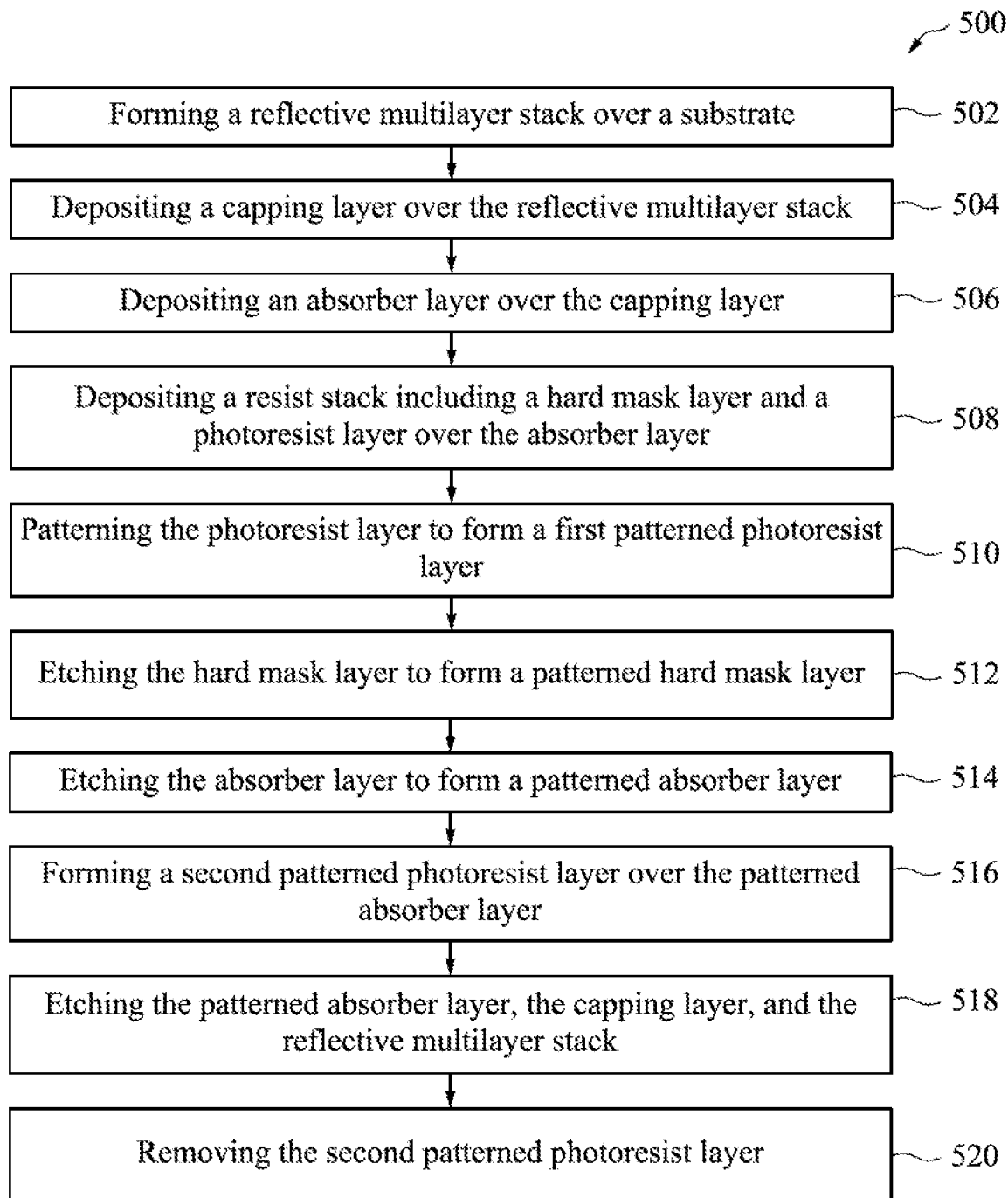
FIG. 5 is a flowchart of a method for fabricating the EUV mask of FIG. 4, in accordance with some embodiments.

FIG. 5 is a flowchart of a method 500 for fabricating an EUV mask, for example, EUV mask 400, in accordance with some embodiments. FIG. 6A through FIG. 6J are cross-sectional views of the EUV mask 400 at various stages of the fabrication process, in accordance with some embodiments. The method 500 is discussed in detail below, with reference to the EUV mask 400. In some embodiments, additional operations are performed before, during, and/or after the method 500, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 6A:
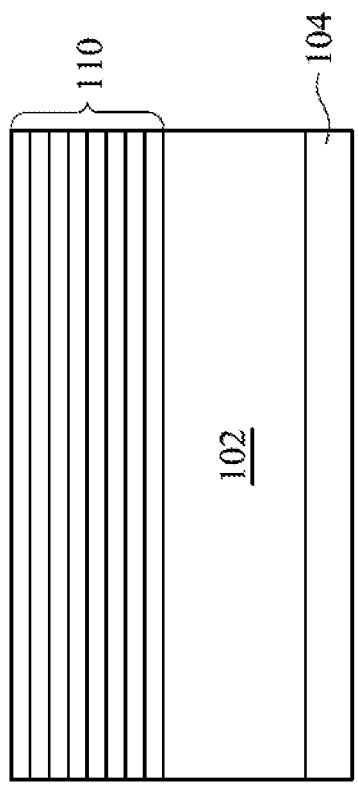
FIGS. 6A-6J are cross-sectional views of an EUV mask at various stages of the fabrication process of FIG. 5, in accordance with some embodiments.

Referring to FIGS. 5 and 6A, the method 500 includes operation 502, in which a reflective multilayer stack 110 is formed over a substrate 102, in accordance with some embodiments. FIG. 6A is a cross-sectional view of an initial structure of an EUV mask 400 after forming the reflective multilayer stack 110 over the substrate 102, in accordance with some embodiments. The materials and formation processes for the reflective multilayer stack 110 are similar to those described above in FIG. 3A, and hence are not described in detail herein.

Figure 6B:
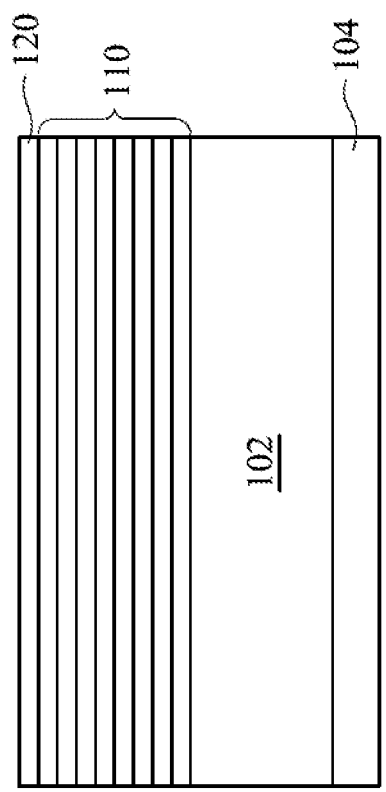

Referring to FIGS. 5 and 6B, the method 500 proceeds to operation 504, in which a capping layer 120 is deposited over the reflective multilayer stack 110, in accordance with some embodiments. FIG. 6B is a cross-sectional view of the structure of FIG. 6A after depositing the capping layer 120 over the reflective multilayer stack 110, in accordance with some embodiments. The materials and formation processes for the capping layer 120 are similar to those described above in FIG. 3B, and hence are not described in detail herein.

Figure 6C:
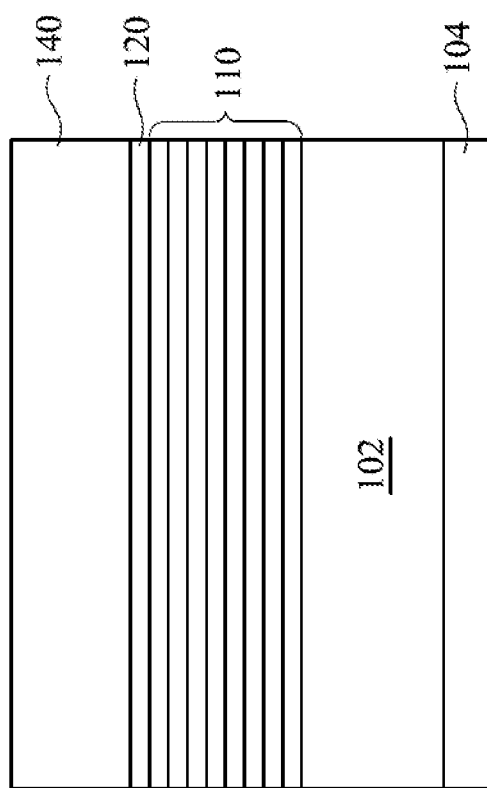

Referring to FIGS. 5 and 6C, the method 500 proceeds to operation 506, in which an absorber layer 140 is deposited over the capping layer 120, in accordance with various embodiments. FIG. 6C is a cross-sectional view of the structure of FIG. 6B after depositing the absorber layer 140 over the capping layer 120, in accordance with some embodiments. The materials and formation processes for the absorber layer 140 are similar to those described above in FIG. 3D, and hence are not described in detail herein.

Figure 6D:
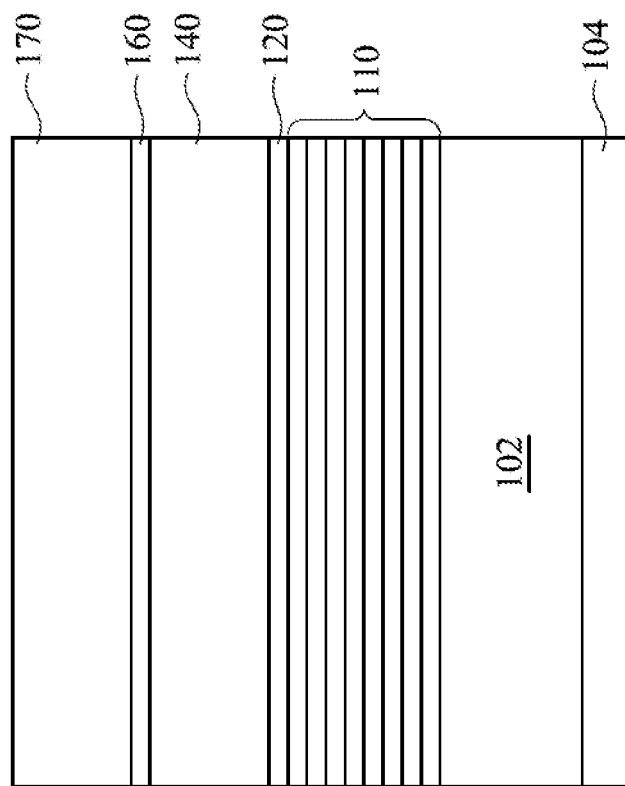

Referring to FIGS. 5 and 6D, the method 500 proceeds to operation 508, in which a resist stack including a hard mask layer 160 and a photoresist layer 170 is deposited over the absorber layer 140, in accordance with some embodiments. FIG. 6D is a cross-sectional view of the structure of FIG. 6C after sequentially depositing the hard mask layer 160 and the photoresist layer 170 over the absorber layer 140, in accordance with some embodiments. Materials and formation processes for respective hard mask layer 160 and photoresist layer 170 are similar to those described in FIG. 3E, and hence are not described in detail herein.

Figure 6E:
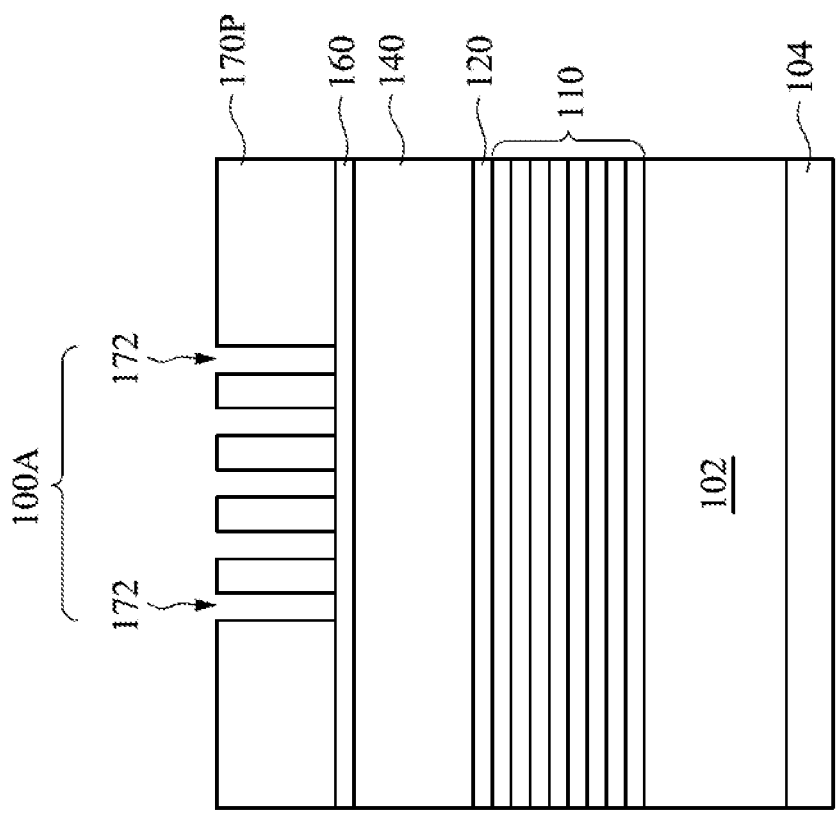

Referring to FIGS. 5 and 6E, the method 500 proceeds to operation 510, in which the photoresist layer 170 is lithographically patterned to form a patterned photoresist layer 170P, in accordance with some embodiments. FIG. 6E is a cross-sectional view of the structure of FIG. 6D after lithographically patterning the photoresist layer 170 to form the patterned photoresist layer 170P, in accordance with some embodiments. Etching processes for the photoresist layer 170 are similar to those described in FIG. 3F, and hence are not described in detail herein.

Figure 6F:
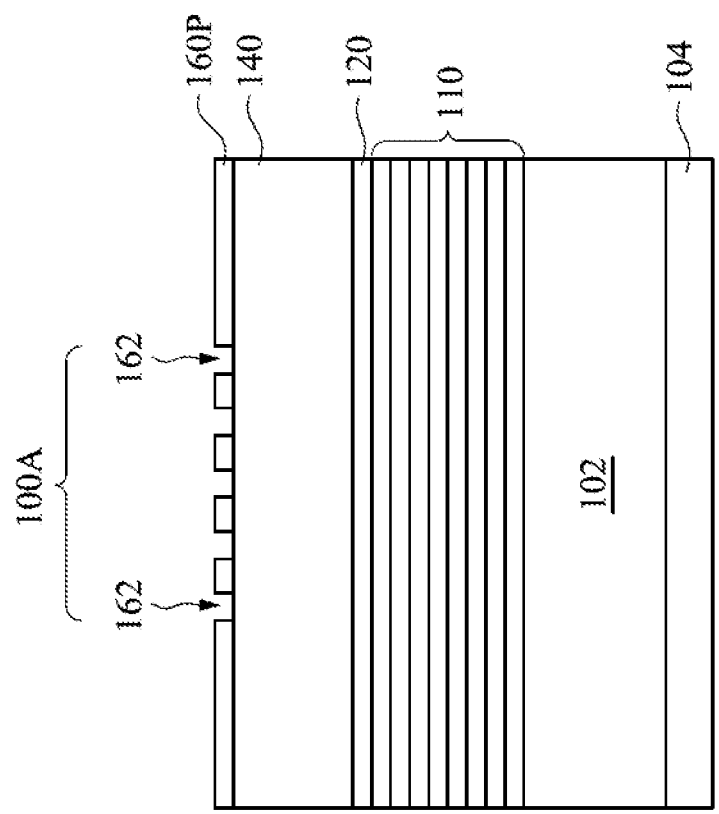

Referring to FIGS. 5 and 6F, the method 500 proceeds to operation 512, in which the hard mask layer 160 is etched using the patterned photoresist layer 170P as an etch mask to form a patterned hard mask layer 160P, in accordance with some embodiments. FIG. 6F is a cross-sectional view of the structure of FIG. 6E after etching the hard mask layer 160 to form the patterned hard mask layer 160P, in accordance with some embodiments. Etching processes for the hard mask layer 160 are similar to those described in FIG. 3G, and hence are not described in detail herein.

Figure 6G:
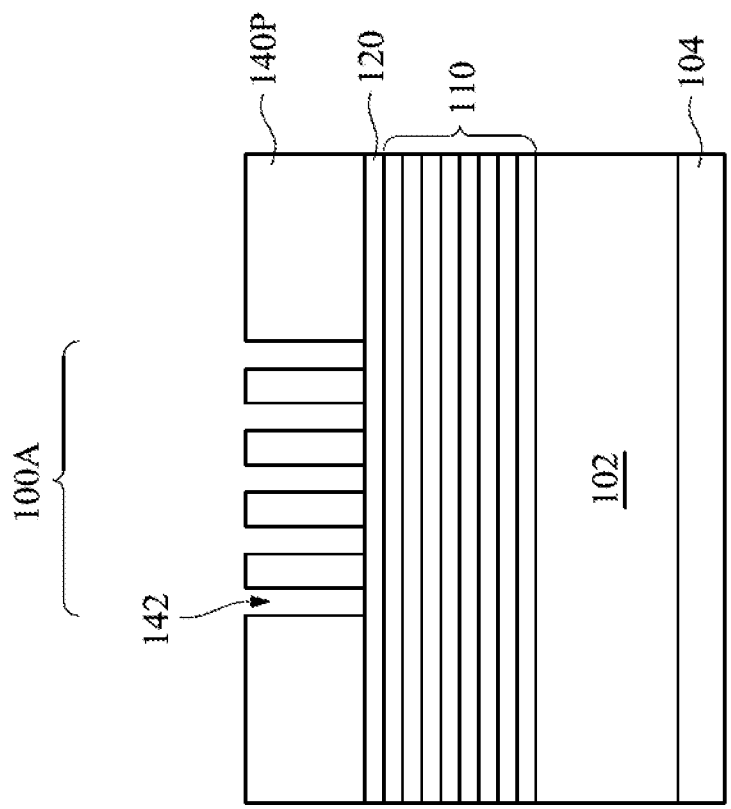

Referring to FIGS. 5 and 6G, the method 500 proceeds to operation 514, in which the absorber layer 140 is etched using the patterned hard mask layer 160P as an etch mask to form a patterned absorber layer 140P, in accordance with some embodiments. FIG. 6G is a cross-sectional view of the structure of FIG. 6F after etching the absorber layer 140 to form the patterned absorber layer 140P, in accordance with some embodiments. Etching processes for the absorber layer 140 are similar to those described in FIG. 3H, and hence are not described in detail herein. The patterned absorber layer 140P includes a plurality of openings 142 that expose the underlying capping layer 120.

After etching the absorber layer 140, the patterned hard mask layer 160P is removed from the surfaces of the patterned absorber layer 140P, for example, using oxygen plasma or a wet etch.

Figure 6H:
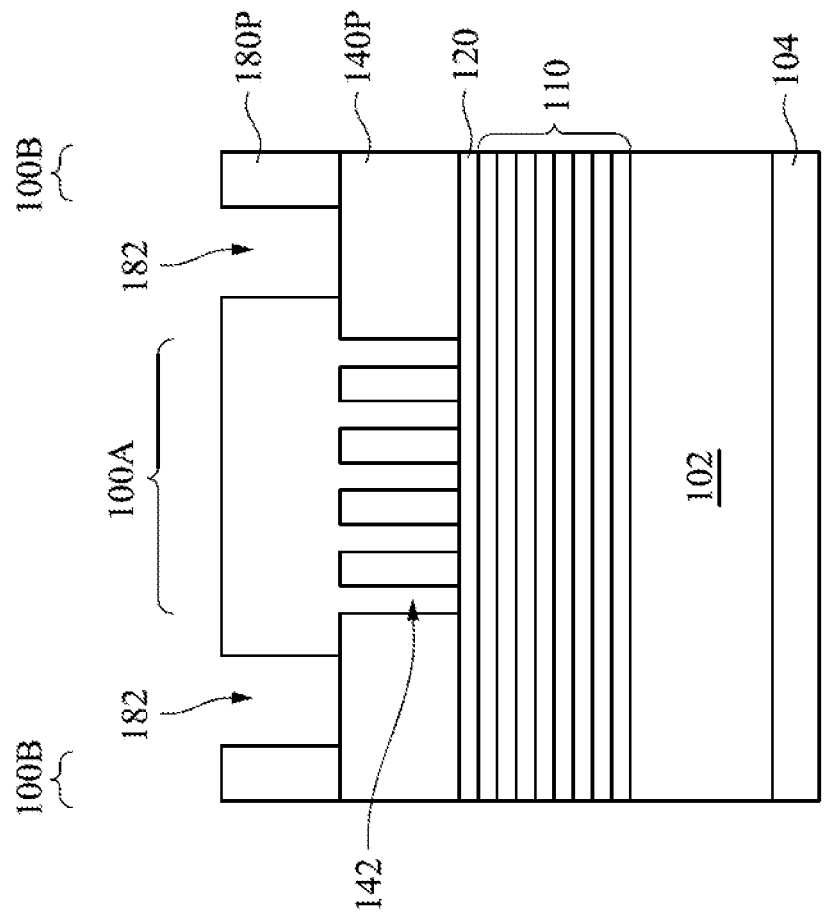

Referring to FIGS. 5 and 6H, the method 500 proceeds to operation 516, in which a patterned photoresist layer 180P comprising a pattern of openings 182 is formed over the patterned absorber layer 140P, in accordance with some embodiments. FIG. 6H is a cross-sectional view of the structure of FIG. 6G after forming the patterned photoresist layer 180P comprising openings 182 over the patterned absorber layer 140P, in accordance with some embodiments. Materials and fabrication processes for the patterned photoresist layer 180P are similar to those described in FIG. 3J, and hence are not described in detail herein.

Figure 6I:
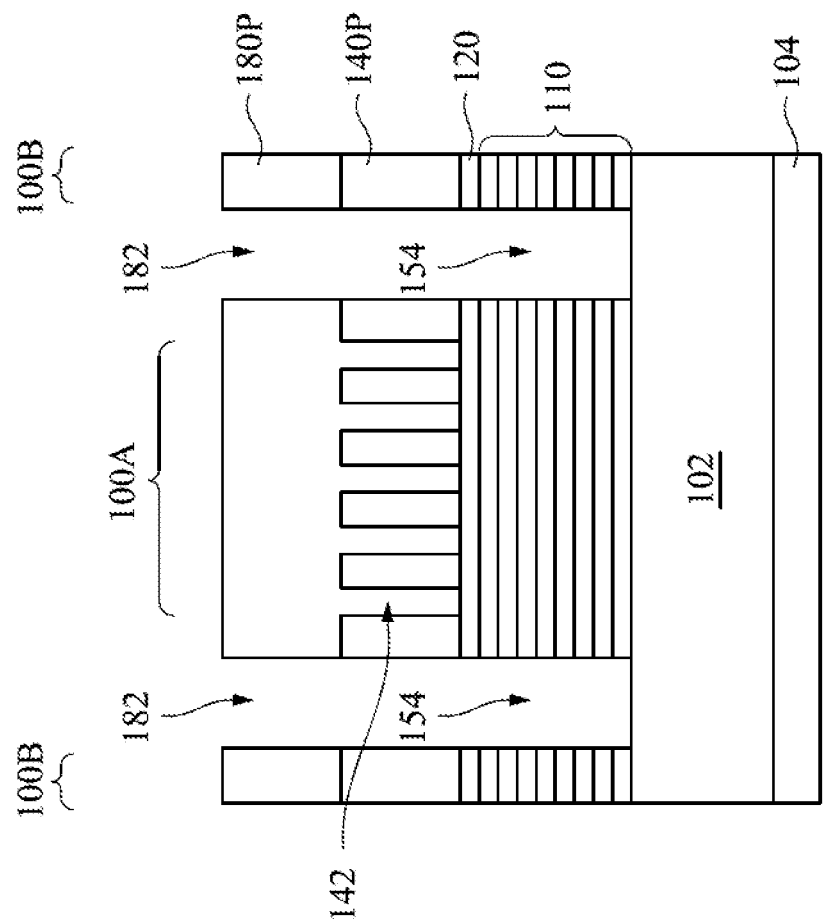

Referring to FIGS. 5 and 6I, the method 500 proceeds to operation 518, in which the patterned absorber layer 140P, the capping layer 120, and the reflective multilayer stack 110 are etched using the patterned photoresist layer 180P as an etch mask to form trenches 154 in the peripheral region 100B of the substrate 102, in accordance with some embodiments. FIG. 6I is a cross-sectional view of the structure of FIG. 6H after etching the patterned absorber layer 140P, the capping layer 120, and the reflective multilayer stack 110, to form the trenches 154 in the peripheral region 100B of the substrate 102, in accordance with some embodiments.

Referring to FIG. 6I, the trenches 154 extend through the patterned absorber layer 140P, the capping layer 120, and the reflective multilayer stack 110 to expose the surface of the substrate 102. The trenches 154 surround the pattern region 100A of the EUV mask 400, separating the pattern region 100A from the peripheral region 100B.

In some embodiments, the patterned absorber layer 140P, the capping layer 120, and the reflective multilayer stack 110 are etched using a single anisotropic etching process. The anisotropic etch can be a dry etch such as, for example, RIE, a wet etch, or a combination thereof that removes materials of the respective patterned absorber layer 140P, the capping layer 120, and the reflective multilayer stack 110, selective to the material providing the substrate 102. In some embodiments, the patterned absorber layer 140P, the capping layer 120, and the reflective multilayer stack 110 are etched using multiple distinct anisotropic etching processes. Each anisotropic etch can be a dry etch such as, for example, RIE, a wet etch, or a combination thereof.

Figure 6J:
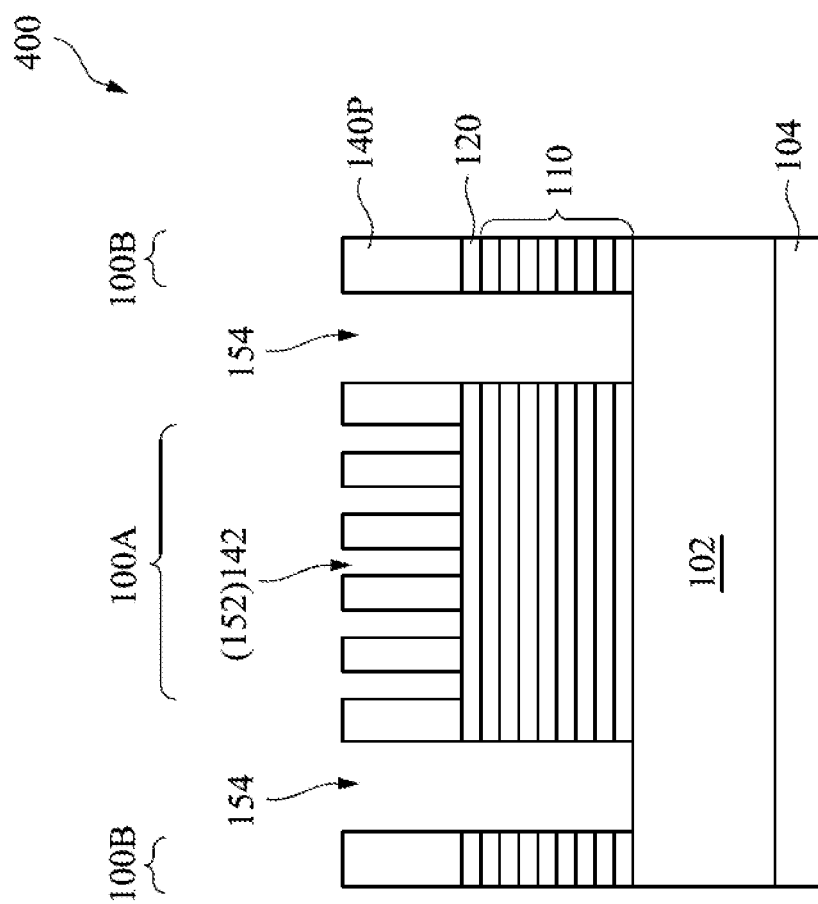

Referring to FIGS. 5 and 6J, the method 500 proceeds to operation 520, in which the patterned photoresist layer 180P is removed, in accordance with some embodiments. FIG. 6J is a cross-sectional view of the structure of FIG. 6I after removing the patterned photoresist layer 180P, in accordance with some embodiments.

Referring to FIG. 6J, the patterned photoresist layer 180P is removed from the pattern region 100A and the peripheral region 100B of the substrate 102, for example, by wet stripping or plasma ashing. The removal of the patterned photoresist layer 180P from the openings 142 in the patterned absorber layer 140P re-exposes the surfaces of the capping layer 120 in the pattern region 100A. The openings 142 in the patterned absorber layer 140P define the pattern of openings 152 in the EUV mask 400.

An EUV mask 400 is thus formed. The EUV mask 400 includes a substrate 102, a reflective multilayer stack 110 over a front surface of the substrate 102, a capping layer 120 over the reflective multilayer stack 110, and a patterned absorber layer 140P over the capping layer 120. The EUV mask 400 further includes a conductive layer 104 over a back surface of the substrate 102 opposite the front surface. The patterned absorber layer 140P includes a Ta-based alloy having a high extinction coefficient, which allows forming a thinner layer. The mask 3D effects caused by the thicker absorber layer can thus be reduced and unnecessary EUV light can be eliminated. As a result, a pattern on the EUV mask 400 can be projected precisely onto a silicon wafer.

After removal of the patterned photoresist layer 180P, the EUV mask 400 is cleaned to remove any contaminants therefrom. In some embodiments, the EUV mask 400 is cleaned by submerging the EUV mask 400 into an ammonium hydroxide (NH$_4$OH) solution. In some embodiments, the EUV mask 400 is cleaned by submerging the EUV mask 400 into a diluted hydrofluoric acid (HF) solution.

The EUV mask 400 is subsequently radiated with, for example, an UV light with a wavelength of 193 nm, for inspection of any defects in the patterned region 100A. The foreign matters may be detected from diffusely reflected light. If defects are detected, the EUV mask 400 is further cleaned using suitable cleaning processes.

One aspect of this description relates to an EUV mask. The EUV mask includes a substrate, a reflective multilayer stack on the substrate, and a patterned absorber layer on the reflective multilayer stack. The patterned absorber layer includes an alloy comprising tantalum (Ta) and at least one alloying element. The at least one alloying element includes at least one transition metal element or at least one Group 14 element.

Another aspect of this description relates to relates to a method of forming an EUV mask. The method includes forming a reflective multilayer stack on a substrate, depositing a capping layer on the reflective multilayer stack, depositing an absorber layer on the capping layer, forming a patterned hard mask layer on the absorber layer, and etching the absorber layer to form a plurality of openings exposing a surface of the capping layer using the patterned hard mask as an etch mask. The absorber layer includes an alloy comprised of tantalum (Ta) and at least one alloying element. The at least one alloying element includes at least one transition metal element or at least one Group 14 element.

Still another aspect of this description relates to a method of forming an extreme EUV mask. The method includes forming a reflective multilayer stack on a substrate. A capping layer is then deposited on the reflective multilayer stack. Next, a buffer layer is formed on the capping layer. An absorber layer is deposited on the buffer layer. The absorber layer includes an alloy comprising tantalum (Ta) and at least one transition metal element selected from the group consisting of titanium (Ti), zirconium (Zr), hafnium (Hf), vanadium (V), niobium (Nb), chromium (Cr), molybdenum (Mo), tungsten (W), iron (Fe), ruthenium (Ru), cobalt (Co), rhodium (Rh), iridium (Ir), nickel (Ni), palladium (Pd), platinum (Pt) and gold (Au). Next, a hard mask layer is formed on the absorber layer. The hard mask layer is then etched to form a patterned hard mask layer. Next, the absorber layer is etched to form a plurality of openings therein using the patterned hard mask layer as an etch mask, the plurality of openings exposing a surface of the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) mask, comprising:
    a substrate;
    a reflective multilayer stack on the substrate;
    a capping layer on the reflective multilayer stack, the capping layer comprising a transition metal;
    a buffer layer on the capping layer, the buffer layer comprising ruthenium boride or ruthenium silicide; and
    a patterned absorber layer on the buffer layer, wherein the patterned absorber layer is a single layer comprising an alloy of tantalum (Ta) and one or more alloying elements, wherein the one or more alloying elements are selected from one or more transition metal elements and one or more Group 14 elements.

2. The EUV mask of claim 1, wherein the capping layer comprises ruthenium (Ru), iridium (Ir), rhodium (Rh), platinum (Pt), palladium (Pd), osmium (Os), rhenium (Re), vanadium (V), Ta, hafnium (Hf), tungsten (W), molybdenum (Mo), zirconium (Zr), manganese (Mn) or technetium (Tc).

3. The EUV mask of claim 2, wherein the capping layer comprises Ru.

4. The EUV mask of claim 1, wherein the one or more transition metal elements are selected from the group consisting of titanium (Ti), Zr, Hf, V, niobium (Nb), chromium (Cr), Mo, W, iron (Fe), Ru, cobalt (Co), Rh, Ir, nickel (Ni), Pd, Pt, and gold (Au).

5. The EUV mask of claim 4, wherein the patterned absorber layer comprises TaCr, TaHf, TaIr, TaNi, TaRu, TaCo, TaAu, TaMo, TaW, TaFe, TaRh, TaV, TaNb, TaPd, TaZr, TaTi or TaPt.

6. The EUV mask of claim 1, wherein the patterned absorber layer comprises TaSi or TaGe.

7. The EUV mask of claim 1, wherein the patterned absorber layer has a thickness ranging from 5 nm to 50 nm.

8. The EUV mask of claim 1, wherein the alloy comprises Ta at a concentration greater than 50 atomic %.

9. The EUV mask of claim 1, wherein the alloy comprises the one or more alloying elements at a concentration greater than 50 atomic %.

10. The EUV mask of claim 1, wherein the alloy is doped with one or more interstitial elements selected from the group consisting of boron (B), carbon (C), nitrogen (N) and oxygen (O).

11. An extreme ultraviolet (EUV) mask, comprising:
a substrate;
a reflective multilayer stack on the substrate;
a capping layer on the reflective multilayer stack;
a buffer layer on the capping layer; and
a patterned absorber layer on the buffer layer, wherein the patterned absorber layer is a single layer comprising an alloy comprising tantalum (Ta) and an alloying element, wherein the alloying element is a transition metal element or a Group 14 element.

12. The EUV mask of claim 11, wherein the alloying element is a transition metal element selected from the group consisting of titanium (Ti), zirconium (Zr), hafnium (Hf), vanadium (V), niobium (Nb), chromium (Cr), molybdenum (Mo), tungsten (W), iron (Fe), ruthenium (Ru), cobalt (Co), rhodium (Rh), iridium (Ir), nickel (Ni), palladium (Pd), platinum (Pt) and gold (Au).

13. The EUV mask of claim 12, wherein the patterned absorber layer comprises tantalum chromium (TaCr), tantalum hafnium (TaHf), tantalum iridium (TaIr), tantalum nickel (TaNi), tantalum ruthenium (TaRu), tantalum cobalt (TaCo), tantalum gold (TaAu), tantalum molybdenum (TaMo), tantalum tungsten (TaW), tantalum iron (TaFe), tantalum rhodium (TaRh), tantalum vanadium (TaV), tantalum niobium (TaNb), tantalum palladium (TaPd), tantalum zirconium (TaZr), tantalum titanium (TaTi) or tantalum platinum (TaPt).

14. The EUV mask of claim 11, wherein the alloying element is a Group 14 element selected from silicon (Si) and germanium (Ge).

15. The EUV mask of claim 14, wherein the patterned absorber layer comprises TaSi or TaGe.

16. The EUV mask of claim 15, wherein the capping layer comprises Ru, and the buffer layer comprises silicon oxide or silicon oxynitride.

17. An extreme ultraviolet (EUV) mask, comprising:
a substrate;
a reflective multilayer stack on the substrate;
a capping layer on the reflective multilayer stack, the capping layer comprising ruthenium (Ru), iridium (Ir), rhodium (Rh), platinum (Pt), palladium (Pd), osmium (Os), rhenium (Re), vanadium (V), tantalum (Ta), hafnium (Hf), tungsten (W), molybdenum (Mo), zirconium (Zr), manganese (Mn) or technetium (Tc);
a buffer layer on the capping layer, the buffer layer comprising ruthenium boride, ruthenium silicide, chromium oxide or chromium nitride; and
a patterned absorber layer on the buffer layer, wherein the patterned absorber layer is a single layer comprising a Ta-containing alloy selected from the group consisting of tantalum chromium (TaCr), tantalum hafnium (TaHf), tantalum iridium (TaIr), tantalum nickel (TaNi), tantalum ruthenium (TaRu), tantalum cobalt (TaCo), tantalum gold (TaAu), tantalum molybdenum (TaMo), tantalum tungsten (TaW), tantalum iron (TaFe), tantalum rhodium (TaRh), tantalum vanadium (TaV), tantalum niobium (TaNb), tantalum palladium (TaPd), tantalum zirconium (TaZr), tantalum titanium (TaTi) and tantalum platinum (TaPt).

18. The EUV mask of claim 17, further comprising a trench at a periphery of the EUV mask, the trench extending through the patterned absorber layer, the buffer layer, the capping layer and the reflective multilayer stack to expose a surface of the substrate.

19. The EUV mask of claim 17, wherein the reflective multilayer stack comprises alternatively stacked layers of Mo and Si or alternatively stacked layers of Mo and beryllium (Be).

20. The EUV mask of claim 17, wherein the patterned absorber layer comprises an amorphous Ta-containing alloy.

* * * * *